(12) United States Patent
Gluschenkov et al.

(10) Patent No.: US 8,455,322 B2
(45) Date of Patent: Jun. 4, 2013

(54) SILICON GERMANIUM HETEROJUNCTION BIPOLAR TRANSISTOR STRUCTURE AND METHOD

(75) Inventors: Oleg Gluschenkov, Poughkeepsie, NY (US); Rajendran Krishnasamy, Essex Junction, NY (US); Kathryn T. Schonenberg, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 433 days.

(21) Appl. No.: 12/719,212

(22) Filed: Mar. 8, 2010

(65) Prior Publication Data

US 2010/0159664 A1    Jun. 24, 2010

Related U.S. Application Data

(62) Division of application No. 11/741,836, filed on Apr. 30, 2007, now Pat. No. 7,750,371.

(51) Int. Cl.
*H01L 21/8242* (2006.01)

(52) U.S. Cl.
USPC ............ 438/289; 438/45; 438/290; 438/341; 438/357; 438/369; 438/378; 438/476; 438/514; 438/522; 438/758; 257/62; 257/131; 257/472; 257/475; 257/486; 257/E33.002; 257/E33.005; 257/E21.002; 257/E21.461; 257/E21.471

(58) Field of Classification Search
USPC ............ 257/62, 131, 472, 475, 486, E33.002, 257/E33.005, E21.001, E21.002, E21.461, 257/E21.471, E21.473; 438/45–47, 289, 438/290, 341, 357, 369, 378, 476, 477, 514, 438/522, 758, 761, 7, 95
See application file for complete search history.

(56) References Cited

U.S. PATENT DOCUMENTS

| | | | |
|---|---|---|---|
| 4,400,715 A | 8/1983 | Barbee et al. | |
| 4,534,806 A | 8/1985 | Magdo | |
| 5,290,716 A | 3/1994 | Nakamura | |
| 6,355,544 B1 | 3/2002 | Essaian et al. | |
| 6,846,710 B2 | 1/2005 | Yi et al. | |
| 6,872,643 B1 * | 3/2005 | Halliyal et al. | 438/557 |
| 6,940,149 B1 | 9/2005 | Divakaruni et al. | |

(Continued)

FOREIGN PATENT DOCUMENTS

JP        57-199236        12/1982

OTHER PUBLICATIONS

Gluschenkov et al., U.S. Appl. No. 11/923,131, Notice of Allowance Communication, Oct. 20, 2010, 5 pages.

(Continued)

*Primary Examiner* — Meiya Li
(74) *Attorney, Agent, or Firm* — Gibb & Riley, LLC; Anthony J. Canale

(57) ABSTRACT

Disclosed is an improved semiconductor structure (e.g., a silicon germanium (SiGe) hetero-junction bipolar transistor) having a narrow essentially interstitial-free SIC pedestal with minimal overlap of the extrinsic base. Also, disclosed is a method of forming the transistor which uses laser annealing, as opposed to rapid thermal annealing, of the SIC pedestal to produce both a narrow SIC pedestal and an essentially interstitial-free collector. Thus, the resulting SiGe HBT transistor can be produced with narrower base and collector space-charge regions than can be achieved with conventional technology.

20 Claims, 8 Drawing Sheets

U.S. PATENT DOCUMENTS

| | | |
|---|---|---|
| 7,144,787 B2 | 12/2006 | Dokumaci |
| 2002/0100916 A1 | 8/2002 | Enquist |
| 2002/0117734 A1 | 8/2002 | Racanelli |
| 2005/0064672 A1 | 3/2005 | Welser et al. |
| 2006/0040453 A1 | 2/2006 | Bock et al. |
| 2006/0060887 A1 | 3/2006 | Geiss et al. |
| 2007/0138576 A1* | 6/2007 | Mizukami et al. ............ 257/390 |
| 2008/0191245 A1 | 8/2008 | Griglione |
| 2008/0203522 A1 | 8/2008 | Mandelman et al. |

OTHER PUBLICATIONS

Gluschenkov et al., U.S. Appl. No. 11/741,836, Restriction Requirement, Aug. 21, 2008, 5 pages.

International Business Machines Corporation, PCT/US/08/61938, PCT International Search Report, Aug. 18, 2008, pp. 1-9.

Gluschenkov et al., U.S. Appl. No. 11/741,836, Office Action Communication, Oct. 15, 2008, 9 pages.

Gluschenkov et al., U.S. Appl. No. 11/741,836, Office Action Communication, May 4, 2009, 15 pages.

Gluschenkov et al., U.S. Appl. No. 11/741,836, Advisory Action, Jul. 2, 2009.

Gluschenkov et al., U.S. Appl. No. 11/741,836, Office Action Communication, Sep. 16, 2009, 12 pages.

Gluschenkov et al., U.S. Appl. No. 11/741,836, Notice of Allowance, Feb. 24, 2010, 3 pages.

Gluschenkov et al., U.S. Appl. No. 11/923,131, Office Action Communication, Jun. 25, 2010, 5 pages.

* cited by examiner

| | Ft GHz) | Fmax(U) (GHz) | Ccb (min) (fF) | Ccb( @ peak Ft) | Rbb (Ohm) |
|---|---|---|---|---|---|
| HBT Without SIC | 369.11 | 205.68 | 4.89 | 5.05 | 98.20 |
| HBT With SIC Using RTA | 303.08 | 235.10 | 3.15 | 3.16 | 130.03 |
| HBT With SIC Using LTP | 367.43 | 257.8 | 3.28 | 3.32 | 108.44 |

Figure 4

SILICON GERMANIUM HETEROJUNCTION BIPOLAR TRANSISTOR STRUCTURE AND METHOD

CROSS-REFERENCE TO RELATED APPLICATIONS

This application is a Division of U.S. application Ser. No. 11/741,836 filed Apr. 30, 2007 now U.S. Pat. No. 7,750,371, issued Jul. 6, 2010 the complete disclosure of which, in its entirety, is herein incorporated by reference.

BACKGROUND

1. Field of the Invention

The embodiments of the invention generally relate to semiconductor structures, and, more particularly, to an improved silicon germanium heterojunction bipolar transistor and a method of forming the improved transistor.

2. Description of the Related Art

New communications and test applications require chips operating at ever-higher frequencies. While high frequency transistors are available in group III-V semiconductor materials (e.g., gallium arsenide (GaAs), gallium nitride (GaN), etc.), a silicon-based solution (e.g., a silicon germanium (SiGe) hetero-junction bipolar transistors (HBTs)) would be less expensive and permit higher levels of integration than is currently available in with such group III-V semiconductor materials.

However, device scaling is also a concern and limitations in current process technology has limited scaling, both vertical and lateral, of such silicon germanium (SiGe) hetero-junction bipolar transistors (HBTs). Specifically, narrowing of the transistor base and collector space-charge region increases the current-gain cut-off frequency ($F_t$), but does so at the expense of the maximum oscillation frequency ($F_{max}$) because of overlap between the collector and extrinsic base. Therefore, in conjunction with device size scaling, it is desirable to bring the collector region closer to the base region in order to enhance $F_t$ by using a selective ion-implanted collector (SIC) pedestal (e.g., as illustrated in U.S. Pat. No. 6,846,710 issued to Yi et al., on Jan. 25, 2005 and incorporated herein by reference). However, current process technology cannot make such an SIC pedestal narrow enough to cause minimal overlap with the extrinsic base. Furthermore, interstitials (i.e., damage, defects, etc.), which are created at the SiGe HBT base-collector interface as a result of the prior art formation processes (i.e., ion-implantation), allow unwanted diffusion of the implanted dopants.

SUMMARY

In view of the foregoing, disclosed herein is an improved silicon germanium (SiGe) hetero-junction bipolar transistor having a narrow essentially interstitial-free SIC pedestal with minimal overlap of the extrinsic base. Also, disclosed is a method of forming the transistor which uses laser annealing, as opposed to rapid thermal annealing, of the SIC pedestal to produce both a narrow SIC pedestal and an essentially interstitial-free collector. Thus, the resulting SiGe HBT transistor can be produced with narrower base and collector space-charge regions than can be achieved with conventional technology.

More particularly, disclosed herein is an embodiment of an improved multi-layered semiconductor structure. The structure comprises a first semiconductor layer and a second semiconductor layer below the first semiconductor layer. Specifically, a top surface of the second semiconductor layer is adjacent to a bottom surface of the first semiconductor layer. The first semiconductor layer is doped with a first dopant (e.g., a p-type dopant such as boron (B)). A peak concentration of this first dopant in the first semiconductor layer can be greater than approximately $1 \times 10^{19}$ cm$^{-3}$ at approximately 0.03 µm above its bottom surface (i.e., above the interface). The second semiconductor layer comprises a diffusion region at that top surface and an implant region below the diffusion region. The implant region can be doped with a second dopant (e.g., an n-type dopant such as phosphorous (P), antimony (Sb) or arsenic (As)) at an approximately uniform concentration. For example, the implant region can have a uniform second dopant concentration that is greater than approximately $1 \times 10^{18}$ cm$^{-3}$.

Thus, the diffusion region can comprise a portion of the first dopant diffused from the first semiconductor layer above and a portion of the second dopant diffused in from the implant region below. However, during the formation process, a laser anneal process can be performed to activate the dopants in the implant region and to remove defects (i.e., interstitials) from the top surface of the second semiconductor layer caused by the ion-implantation process that forms the implant region. Using a laser anneal process, vice a rapid thermal anneal process, minimizes diffusion of the second dopant from the implant region. Furthermore, since the top surface of the second semiconductor layer has approximately no defects, diffusion of the first dopant into the diffusion region from the first semiconductor layer into the second semiconductor layer is minimized.

Thus, due to the lack of interstitials at the interface, the second semiconductor layer, and particularly, the diffusion region of the second semiconductor layer can comprise a first dopant concentration profile having a first dopant concentration just below the interface that is at least 100 times less than the peak concentration of the first dopant in the first semiconductor layer just above the interface (i.e., the peak concentration of the first dopant above the interface is at least 100 times greater than the concentration of the first dopant below the interface). For example, if the peak concentration of the first dopant in the first semiconductor layer is greater than $1 \times 10^{19}$ cm$^{-3}$ at approximately 0.03 µm above the interface, then due to the lack of interstitials at the interface, the first dopant concentration just below the interface can be less than approximately $1 \times 10^{17}$ cm$^{-3}$ and can further decrease dramatically towards the implant region.

Furthermore, due to minimized diffusion of the second dopant from the implant region, the second semiconductor layer can further comprise a second dopant concentration profile in which the concentration of the second dopant is approximately uniform in the implant region but decreases dramatically through the diffusion region towards the interface. For example, the concentration of the second dopant at the implant region can be greater than approximately ten times the concentration of the second dopant at the top surface of the second semiconductor layer (i.e., just below the interface). For example, the concentration of the second dopant in the implant region can be uniform and can be greater than approximately $1 \times 10^{18}$ cm$^{-3}$; however, in the diffusion region the second dopant concentration can increase from less than approximately $1 \times 10^{17}$ cm$^{-3}$ at the top surface of the second semiconductor layer to approximately $1 \times 10^{18}$ cm$^{-3}$ at the implant region (e.g., at approximately 0.02 µm below the top surface).

This semiconductor structure can, for example, be incorporated into a silicon germanium hetero-junction bipolar transistor in order to improve both the current-gain cut-off frequency ($F_t$) and the maximum oscillation frequency ($F_{max}$). That is, such a bipolar transistor can comprise a base layer (e.g., an epitaxially grown silicon germanium base layer) that is in situ doped with a first dopant (e.g., a p-type dopant such as boron (B)). A peak concentration of this first dopant in the base layer can be greater than approximately $1 \times 10^{19}$ cm$^{-3}$ at approximately 0.03 μm above the interface (i.e., above its top surface). The base layer can be formed above a collector layer (e.g., a silicon collector layer). Specifically, a top surface of the collector layer can be adjacent to a bottom surface of the base layer. The collector layer can comprise a diffusion region at that top surface and an implant region below the diffusion region. The implant region can be doped with a second dopant (e.g., an n-type dopant such as phosphorous (P), antimony (Sb) or arsenic (As)) at an approximately uniform concentration. For example, the implant region can have a uniform second dopant concentration that is greater than approximately $1 \times 10^{18}$ cm$^{-3}$.

Thus, the diffusion region can comprise a portion of the first dopant diffused from the base layer above and a portion of the second dopant diffused in from the implant region below. However, during the formation process, a laser anneal process can be performed to activate the dopants in the implant region and to remove defects from the top surface of the collector layer caused by the ion-implantation process that forms the implant region. Using a laser anneal process, vice a rapid thermal anneal process, minimizes diffusion of the second dopant from the implant region. Furthermore, since the top surface of the collector layer has approximately no defects, diffusion of the first dopant from the base layer into the collector layer below is minimized.

Thus, due to the lack of interstitials at the interface, the collector layer and, particularly, the diffusion region of the collector layer can comprise a first dopant concentration profile with a first dopant concentration just below the interface between the base and collector layers that is at least 100 times less than the peak concentration of the first dopant in the base layer just above the interface (e.g., at approximately 0.03 μm above the interface). That is, the peak concentration of the first dopant above the interface can be at least 100 times greater than the concentration of the first dopant below the interface. For example, the peak concentration of the first dopant just above the interface can be greater than approximately $1 \times 10^{19}$ cm$^{-3}$ and the first dopant concentration just below the interface can be less than approximately $1 \times 10^{17}$ cm$^{-3}$ This first dopant concentration profile can further decrease dramatically between the interface and the implant region.

Furthermore, due to minimized diffusion of the second dopant from the implant region, the collector layer can further comprise a second dopant concentration profile in which the concentration of the second dopant is approximately uniform in the implant region but decreases dramatically through the diffusion region towards the interface between the base and collector layers. For example, the concentration of the second dopant at the implant region is greater than approximately ten times the concentration of the second dopant at the top surface of the collector layer (i.e., just below the interface). For example, the concentration of the second dopant in the implant region can be uniform and can be greater than approximately $1 \times 10^{18}$ cm$^{-3}$; however, in the diffusion region the second dopant concentration can increase from less than approximately $1 \times 10^{17}$ cm$^{-3}$ near the top surface of the collector layer (i.e., just below the interface) to approximately $1 \times 10^{18}$ cm$^{-3}$ at the implant region (e.g., at approximately 0.02 μm below the top surface).

A bipolar transistor with the above-described dopant concentration profiles can have both a current-gain cut-off frequency ($F_t$) of greater than approximately 365.00 GHz and a maximum oscillation frequency ($F_{max}$) of greater than approximately 255.00 GHz, which has heretofore been unachievable with conventional technologies. It can further have a collector-base capacitance (Ccb) of less than approximately 3.40 fF and a sheet base resistance (Rbb) of less than approximately 110.00 Ohms.

Also, disclosed are embodiments of a method of forming the improved semiconductor structure and, particularly, the improved bipolar transistor structure, described above. The method comprises providing a substrate (e.g., a semiconductor wafer) and forming an initial semiconductor layer on the wafer. The initial semiconductor layer can be formed by epitaxially growing a semiconductor on the semiconductor wafer, using conventional processing techniques.

Then, a dopant (i.e., second dopant) can be implanted into the initial semiconductor layer at a predetermined depth (e.g., at approximately 0.03 μm below the top surface of the initial semiconductor layer) in order to form an implant region having an approximately uniform second dopant concentration (e.g., a uniform second dopant concentration of greater than approximately $1 \times 10^{18}$ cm$^{-3}$). This second dopant can, for example, comprise an n-type dopant such as phosphorous (P), antimony (Sb) or arsenic (As).

Following the implantation process, the second dopant in the implant region is activated and any defects that were formed on the top surface of the initial semiconductor layer as a result of the implantation process are removed by performing a laser anneal (e.g., a laser thermal process (LTP) or a laser spike anneal (LSA)). This laser anneal is performed at temperatures greater than approximately 1100° C. and using a technique that avoids melting of the initial semiconductor layer and achieves a thermal equilibrium in the semiconductor layer in less than approximately 10 ps (i.e., using a millisecond laser anneal process) in order to minimize diffusion of the second dopant from the implant region and, thereby, keep the second dopant profile narrow. Specifically, diffusion of the second dopant is minimized using this laser anneal such that a concentration profile of the second dopant outside of the implant region decreases (e.g., from approximately $1 \times 10^{18}$ cm$^{-3}$ at approximately 0.02 μm below the top surface of the initial semiconductor layer to less than approximately $1 \times 10^{17}$ cm$^{-3}$ near the top surface). The use of such a laser anneal further avoids clustering of point defects and forming of extended defects and dislocation loops at the top surface the semiconductor layer during subsequent processing. This LTP process methodology does not affect the impact of subsequent process conditions.

Once the laser anneal is performed, an additional semiconductor layer is formed on the top surface of the initial semiconductor layer such that it is doped with a different dopant (i.e., a first dopant). This first dopant can be different from the second dopant and can, for example, comprise a p-type dopant such as boron (B). This additional semiconductor layer can, for example, be formed by epitaxially growing the additional semiconductor layer and simultaneously in-situ doping it with the first dopant. The doping of the additional semiconductor layer can be performed such that a peak concentration of the first dopant in the additional semiconductor layer is greater than approximately $1 \times 10^{19}$ cm$^{-3}$ at approximately 0.03 μm above the top surface of the initial semiconductor layer below (i.e., above the interface between the two semiconductor layers).

Diffusion of this first dopant from the additional semiconductor layer into the initial semiconductor layer below is minimized due to the defect removal process (discussed above). That is, removal of the defects at the top surface of the initial semiconductor layer by laser anneal minimizes unwanted defect-enhanced diffusion of the first dopant and, thereby, keeps the first dopant profile narrow. Specifically, diffusion of the first dopant from the additional semiconductor layer into the initial semiconductor layer below is minimized by the lack of defects at the interface (i.e., interstitials) such that a peak concentration of the first dopant in the additional semiconductor layer adjacent to the bottom surface can be at least 100 times or greater than the concentration of that same first dopant in the initial semiconductor layer.

For example, the first dopant diffusion from the additional semiconductor layer into the initial semiconductor layer can be minimized such that a peak concentration of the first dopant in the additional semiconductor layer remains greater than approximately $1 \times 10^{19}$ cm$^{-3}$ at approximately 0.03 μm above the top surface of the initial semiconductor layer (i.e., above the interface) and a concentration profile of the first dopant in the diffusion region of the initial semiconductor layer is less than approximately $1 \times 10^{17}$ cm$^{-3}$ just below the interface and decreases dramatically towards the implant region.

The above-described method can, for example, be used to form a hetero-junction bipolar transistor that has improved current-gain cut-off frequency ($F_t$) and the maximum oscillation frequency ($F_{max}$) over such transistors formed using conventional methods.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 4 is table comparing performance of the bipolar transistor structure of FIG. 1 with prior art bipolar transistor structures;

DETAILED DESCRIPTION OF PREFERRED EMBODIMENTS

Figure 1:
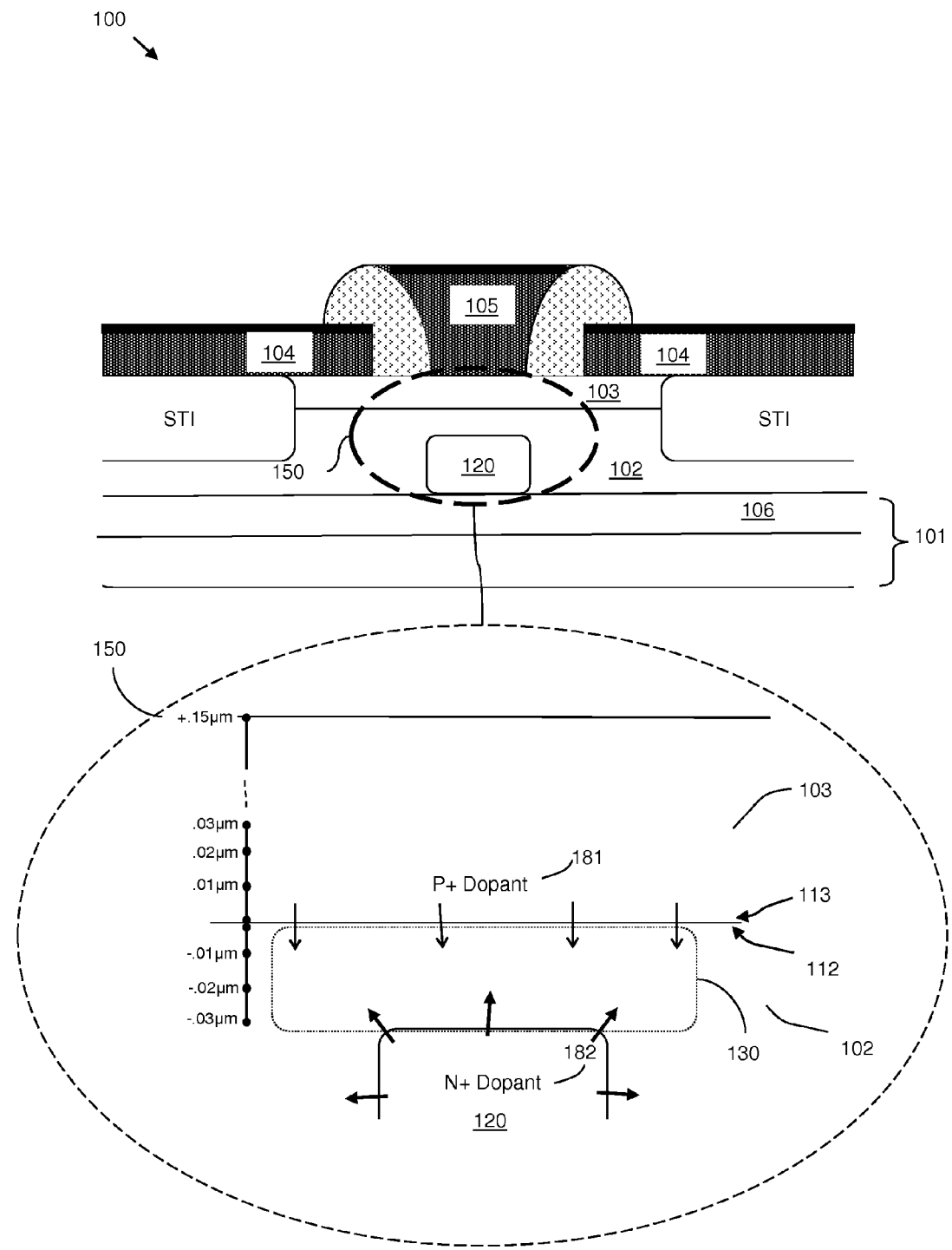
FIG. 1 is a schematic block diagram illustrating an embodiment of the structure of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, limitations in current process technology has limited both vertical and lateral scaling of silicon germanium (SiGe) hetero-junction bipolar transistors (HBTs). Specifically, narrowing of the transistor base and collector space-charge region increases the current-gain cut-off frequency ($F_t$), but does so at the expense of the maximum oscillation frequency ($F_{max}$) because of overlap between the collector and extrinsic base. Therefore, in conjunction with device size scaling, selective ion-implanted collector (SIC) pedestals (e.g., as illustrated in U.S. Pat. No. 6,846,710 issued to Yi et al., on Jan. 25, 2005 and incorporated herein by reference) have been incorporated into such SiGe HBTs in order to bring the collector region closer to the base region and, thereby, to enhance $F_t$. However, current process technology cannot make a SiGe HBT SIC pedestal that is narrow enough to cause minimal overlap with the extrinsic base. Furthermore, interstitials (i.e., spaces, defects, etc.) are created at the SiGe HBT base-collector interface as a result of the prior art formation processes (i.e., ion-implantation (I/I) followed by a high temperature rapid thermal anneal (RTA)). More specifically, an SIC is typically formed using an ion-implantation process that generates a lot of damage in the silicon lattice. A high temperature RTA process is then used to remove the damage caused by the ion-implantation process and further to allow base dopant atoms (e.g., boron) enough energy to move to an electrically active site. However, thermal cycles of a RTA process are typically on the order of seconds, which can allow for excessive diffusion of the base dopant, widening the base dopant profile. This diffusion is enhanced by the ion-implantation defects and can lead to an increase in the junction depth and to deactivation of the dopant, thereby, causing an increase in sheet resistance. Furthermore, the typical RTA thermal cycle permits point defects to cluster and form extended defects and dislocation loops. These defects and dislocation loops sitting in an electrical junction may cause reduction of carrier mobility, increase leakage current and degraded device performance.

Therefore, disclosed herein is an improved silicon germanium (SiGe) hetero-junction bipolar transistor having a narrow essentially interstitial-free SIC pedestal with minimal overlap of the extrinsic base. Also, disclosed is a method of forming the transistor which uses laser annealing, as opposed to rapid thermal annealing, of the SIC pedestal to produce both a narrow SIC pedestal and an essentially interstitial-free collector. Thus, the resulting SiGe HBT transistor can be produced with narrower base and collector space-charge regions than can be achieved with conventional technology.

Referring to FIG. 1, disclosed herein is an embodiment of an improved multi-layered semiconductor structure 150. The structure 150 comprises a first semiconductor layer 103 and a second semiconductor layer 102 below the first semiconductor layer 103. Specifically, a top surface 112 of the second semiconductor layer 102 is adjacent to a bottom surface 113 of the first semiconductor layer 103.

The first semiconductor layer 103 is doped with a first dopant 181 (e.g., at a peak concentration of approximately $1\times10^{19}$ cm$^{-3}$ at approximately 0.03 μm above the interface between the bottom surface of the first semiconductor layer 103 and the top surface of the second semiconductor layer 103). The second semiconductor layer 102 can further comprise a diffusion region 130 at its top surface 112 (i.e., just below the interface between the layers 102-103) and an implant region 120 below the diffusion region 130. The implant region 120 can, for example, be doped with a second dopant 182 (e.g., an n-type dopant such as phosphorous (P), antimony (Sb) or arsenic (As)) at an approximately uniform concentration that is, for example, greater than approximately $1\times10^{18}$ cm$^{-3}$.

Thus, the diffusion region 130 can comprise not only a portion of the first dopant 181 diffused from the first semiconductor layer 103 above but also a portion of the second dopant 182 diffused in from the implant region 120 below. However, during the formation process, a laser anneal process can be performed to remove defects from the top surface 112 of the second semiconductor layer 102. More specifically, this laser anneal process is performed to remove defects that are caused by the ion-implantation process that forms the implant region 130 and to activate the dopants 182 in the implant region 130. Using this laser anneal process, vice a rapid thermal anneal process, minimizes diffusion of the second dopant 182 from the implant region 120 into the diffusion region 130.

Thus, due to the lack of defects (i.e., interstitials) at the interface, diffusion between the layers 102-103 is minimized and a peak concentration of this first dopant in the first semiconductor layer 103 near its bottom surface 113 can be at least 100 times greater than a concentration of that same first dopant in the diffusion region 130 of the second semiconductor layer 102. For example, as mentioned above, the first semiconductor layer 103 can be doped with a first dopant 181 (e.g., a p-type dopant such as boron (B)). A peak concentration of this first dopant in the first semiconductor layer 103 can be greater than approximately $1\times10^{19}$ cm$^{-3}$ at approximately 0.03 μm above its bottom surface 113. Additionally, due to the lack of interstitials at the interface 112-113 between the layers 102-103, the peak concentration of this first dopant in the first semiconductor layer 103 can remain greater than approximately $1\times10^{19}$ cm$^{-3}$ and the diffusion region 130 of the second semiconductor layer 102 can comprise a first dopant concentration profile with a first dopant concentration just below the interface that is less than approximately $1\times10^{17}$cm$^{-3}$ and that decreases with depth (see FIG. 2). That is, the peak concentration of the first dopant above the interface is at least 100 times greater than the concentration of the first dopant below the interface.

Furthermore, due to minimized diffusion of the second dopant 182 from the implant region 120, the second semiconductor layer 102 can further comprise a second dopant concentration profile in which the concentration of the second dopant 182 is approximately uniform in the implant region 120 but decreases dramatically through the diffusion region 130 from the implant region 120 towards the interface 112-113 between the two semiconductor layers 102-103. For example, the concentration of the second dopant 182 at the implant region 120 can greater than approximately ten times the concentration of the second dopant 182 at the top surface 112 of the second semiconductor layer 102. For example, the concentration of the second dopant 182 in the implant region 120 can be uniform and can be greater than approximately $1\times10^{18}$ cm$^{-3}$; however, in the diffusion region 130 this concentration can increase from less than approximately $1\times10^{17}$cm$^{-3}$ near the top surface 112 of the second semiconductor layer 112 (i.e., just below the interface) to approximately $1\times10^{18}$ cm$^{-3}$ at the implant region 120 (e.g., at approximately 0.02 μm below the interface) (see FIG. 3).

Additionally, this semiconductor structure 150 can, for example, be incorporated into a silicon germanium heterojunction bipolar transistor 100 in order to improve both the current-gain cut-off frequency ($F_t$) and the maximum oscillation frequency ($F_{max}$). Specifically, the bipolar transistor structure 100 of FIG. 1 is similar to prior art bipolar transistor structures in that it can comprise a semiconductor substrate 101 that is doped with a first conductivity type dopant 181 (e.g., a substrate doped with a p-type dopant such as boron (B)). A top layer 106 of the substrate 101 can further be doped with a second conductivity type dopant 182 (e.g., an n-type dopant such as phosphorous (P), antimony (Sb) or arsenic (As)), thereby, forming a highly doped sub-collector (i.e., a buried collector) layer 106 at the top of the substrate 101.

The bipolar transistor structure 100 can further comprise a collector layer 102 (e.g., an epitaxially grown silicon layer) on the buried collector layer 106. Impurity ions from the buried collector layer 106 can diffuse into the collector layer 102 so that the collector layer is lightly doped with the second conductivity type dopant 182. This collector layer 102 can further comprise a selective implant collector (SIC) pedestal 120 that is implanted with the second conductivity type dopant such that the collector layer 102 is heavily doped within this limited pedestal region.

The bipolar transistor structure 100 can also comprise an epitaxially grown silicon-germanium intrinsic base 103 that is in-situ doped with the first conductivity type dopant 181 (e.g., a p-type dopant such as boron (B)). That is, the base layer 103 can be formed such that the top surface 112 of the collector layer 102 is adjacent to the bottom surface 113 of the base layer 103.

Finally, the bipolar transistor 100 can further comprise an emitter 105 that is doped with the second conductivity type dopant 182 (e.g., an n-type dopant such as phosphorous (P), antimony (Sb) or arsenic (As)) and an extrinsic base 104 on either side of the emitter 105 above the intrinsic base 103.

However, the bipolar transistor structure 100 can be distinguished from prior art silicon-germanium hetero-junction bipolar transistors in that, due to the techniques used to form the structure, the SIC pedestal 120 is essentially interstitial free and there is minimal overlap of the extrinsic base. Thus, the base and collector space-charge regions are narrower than can be achieved with conventional technology.

More specifically, referring to FIG. 1, such a bipolar transistor 100 can comprise a base layer 103 (e.g., an epitaxially grown silicon germanium base layer) that is in situ doped with a first dopant (e.g., a p-type dopant such as boron (B)). A peak concentration of first dopant 181 in the base layer 103 can be approximately $1\times10^{19}$ cm$^{-3}$ at approximately 0.03 μm above the interface between the bottom surface 113 of the base layer 103 and the top surface 112 of the collector layer 103 (see FIG. 2). The base layer 103 can be formed (i.e., epitaxially grown and in-situ doped) above a collector layer 102 (e.g., a silicon collector layer). Specifically, the top surface 112 of the collector layer 102 can be adjacent to the bottom surface 113 of the base layer 103. The collector layer 102 can comprise a diffusion region 130 at its top surface 112 (i.e., just below the interface between the layers 102-103) and a selective implant collector region (SIC) 120 below the diffusion region 130. The implant region 120 can be doped with a second dopant (e.g., an n-type dopant such as phosphorous (P), antimony (Sb) or arsenic (As)) at an approximately uniform concentration, for example, that is greater than approximately $1 \times 10^{18}$ $cm^{-3}$.

Thus, the diffusion region 130 can comprise a portion of the first dopant 181 diffused from the base layer 103 above and a portion of the second dopant 182 diffused in from the SIC region 120 below. However, during the formation process, a laser anneal process can be performed. This laser anneal process is performed in order to activate the dopants 182 in the implant region 120 as well as to remove defects from the top surface 112 of the collector layer 103 caused by the ion-implantation process that forms the implant region 120. Using a laser anneal process, vice a conventional rapid thermal anneal (RTA) process, minimizes diffusion of the second dopant 182 from the implant region 120 as well as diffusion of the first dopant between the layers 102-103.

Thus, due to the lack of interstitials at the interface 112-113 between the layers 102-103, the diffusion region 130 of the collector layer 102 can comprise a first dopant concentration profile with a first dopant concentration just below the interface between the base and collector layers that is at least 100 times less than the peak concentration of the first dopant in the base layer just above the interface (e.g., at approximately 0.03 μm above the interface. That is, the peak concentration of the first dopant above the interface is at least 100 times greater than the concentration of the first dopant below the interface. For example, if the peak concentration of the first dopant 181 is approximately $1 \times 10^{19}$ $cm^{-3}$ at approximately 0.03 μm above the interface, the first dopant concentration just below the interface can be less than approximately $1 \times 10^{17} cm^{-3}$ and that decreases with depth (see FIG. 2).

Furthermore, due to minimized diffusion of the second dopant 182 from the implant region 120 the collector layer 102 can further comprise a second dopant concentration profile in which the concentration of the second dopant 182 is approximately uniform within the implant region 120 but decreases dramatically through the diffusion region 130 from the implant region 120 towards the interface 112-113 between the base and collector layers 102-103. For example, the concentration of the second dopant 182 at the implant region 120 can be greater than approximately ten times the concentration of the second dopant 182 at the top surface 112 of the collector layer 102 (i.e., just below the interface). For example, the concentration of the second dopant in the implant region can be uniform and can be greater than approximately $1 \times 10^{18}$ $cm^{-3}$; however, in the diffusion region 130 this second dopant concentration can increase from less than approximately $1 \times 10^{17} cm^{-3}$ near the top surface 112 of the collector layer 102 (i.e., just below the interface) to approximately $1 \times 10^{18}$ $cm^{-3}$ just at the implant region 120 (e.g., at approximately 0.02 μm below the top surface 112) (see FIG. 3).

As illustrated in FIG. 4, a bipolar transistor 100 with the above-described dopant concentration profiles can exhibit both a current-gain cut-off frequency ($F_t$) of greater than approximately 365.00 GHz and a maximum oscillation frequency ($F_{max}$) of greater than approximately 255.00 GHz, which has heretofore been unachievable with conventional technologies. It can further have a collector-base capacitance (Ccb) of less than approximately 3.40 fF and a sheet base resistance (Rbb) of less than approximately 110.00 Ohms.

Also, disclosed are embodiments of a method of forming the improved semiconductor structure 150 and, particularly, the improved bipolar transistor structure 100, described above.

Figure 5:
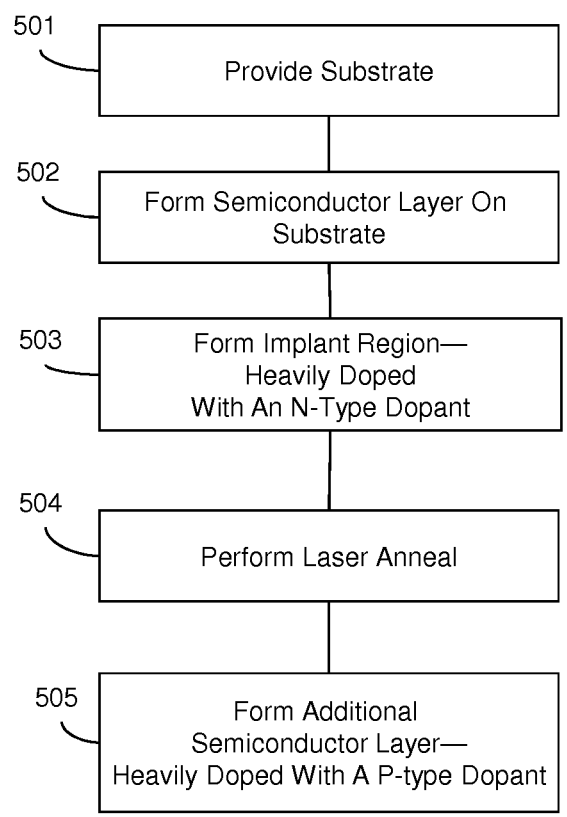
FIG. 5 is a flow diagram illustrating an embodiment the method of the invention.

More particularly, referring to FIG. 5 in combination with FIG. 1, an embodiment of the method comprises providing a substrate (e.g., a semiconductor wafer) (501) and forming an inital semiconductor layer 102 on the wafer (502). The initial semiconductor layer 102 can be formed by epitaxially growing a semiconductor on the semiconductor wafer, using conventional processing techniques.

Then, a dopant 182 (i.e., second dopant) can be implanted into the initial semiconductor layer at a predetermined depth (e.g., approximately 0.03 μm below the top surface of the semiconductor layer) in order to form an implant region 120 having, for example, an approximately uniform second dopant concentration of greater than approximately $1 \times 10^{18}$ $cm^{-3}$ (503). This second dopant 182 can, for example, comprise an n-type dopant such as phosphorous (P), antimony (Sb) or arsenic (As). Formation of the implant region 120 in the desired region of the semiconductor layer 102 can be accomplished by a conventional masked ion-implantation process (e.g., by depositing a photo-resist layer, patterning the photo-resist layer to expose a desired portion of the semiconductor layer 102 and implanting the selected dopant 182 into the exposed portion of the semiconductor layer 102).

Following the implantation process, the second dopant 182 in the implant region 120 is activated and any defects that were formed on the top surface 112 of the initial semiconductor layer 102 as a result of the implantation process are removed by performing a laser anneal (e.g., a laser thermal process (LTP) or a laser spike anneal (LSA)) (504). This laser anneal is performed at temperatures greater than approximately 1100° C. and using a technique that avoids melting of the initial semiconductor layer 102 and achieves a thermal equilibrium in the semiconductor layer in less than approximately 10 ps (i.e., using a millisecond laser anneal process). That is, the laser interacts with the silicon, transferring its energy to the lattice and, thereby, causing increased lattice vibration. The increased lattice vibrations create heat and in doing so allow thermal equilibrium to be achieved in less than 10 ps. This fast thermal equilibrium minimizes diffusion of the second dopant from the implant region and, thereby, keeps the second dopant profile narrow. Specifically, diffusion of the second dopant 182 is minimized using this laser anneal, for example, such that a concentration profile of the second dopant 182 outside of the implant region 120 decreases between the implant region 120 and the top surface 112 of the initial semiconductor layer 102 (e.g., from approximately $1 \times 10^{18}$ $cm^{-3}$ at approximately 0.02 μm below the top surface of the semiconductor layer to less than approximately $1 \times 10^{17} cm^{-3}$ near the top surface 112. The use of such a laser anneal further avoids clustering of point defects and forming of extended defects and dislocation loops at the top surface the semiconductor layer during subsequent processing.

Once the laser anneal is performed, an additional semiconductor layer 103 is formed on the top surface of the initial semiconductor layer 102 such that it is heavily doped with a different dopant 181 (i.e., a first dopant) (505). This first dopant 181 can be different from the second dopant and can, for example, comprise a p-type dopant such as boron (B). This additional semiconductor layer 103 can, for example, be formed by epitaxially growing the additional semiconductor layer 103 on top of the initial semiconductor layer 102 and simultaneously in-situ doping it with the first dopant 181

(e.g., such that a peak concentration of the first dopant 181 in the additional semiconductor layer 103 is greater than approximately $1\times10^{19}$ cm$^{-3}$ at approximately 0.03 µm above the top surface 112 of the semiconductor layer 102 below (i.e., above the interface between the layers 102-103).

Diffusion of this first dopant 181 from the additional semiconductor layer 103 into the initial semiconductor layer 102 below is minimized due to the defect removal process (discussed above at process 504). That is, removal of the defects minimizes unwanted defect-enhanced diffusion of the first dopant 181 and, thereby, maintains the desired dopant concentration in the additional semiconductor layer and further keeps the dopant profile narrow. Specifically, diffusion of the first dopant 181 from the additional semiconductor layer 103 into the initial semiconductor layer 102 below is minimized by the lack of defects at the interface 112-113 (i.e., the lack of interstitials) such that a peak concentration of the first dopant 181 in the additional semiconductor layer 103 adjacent to the bottom surface 113 can remain at least 100 times greater than a concentration of that same first dopant in the initial semiconductor layer 102.

Figure 2:
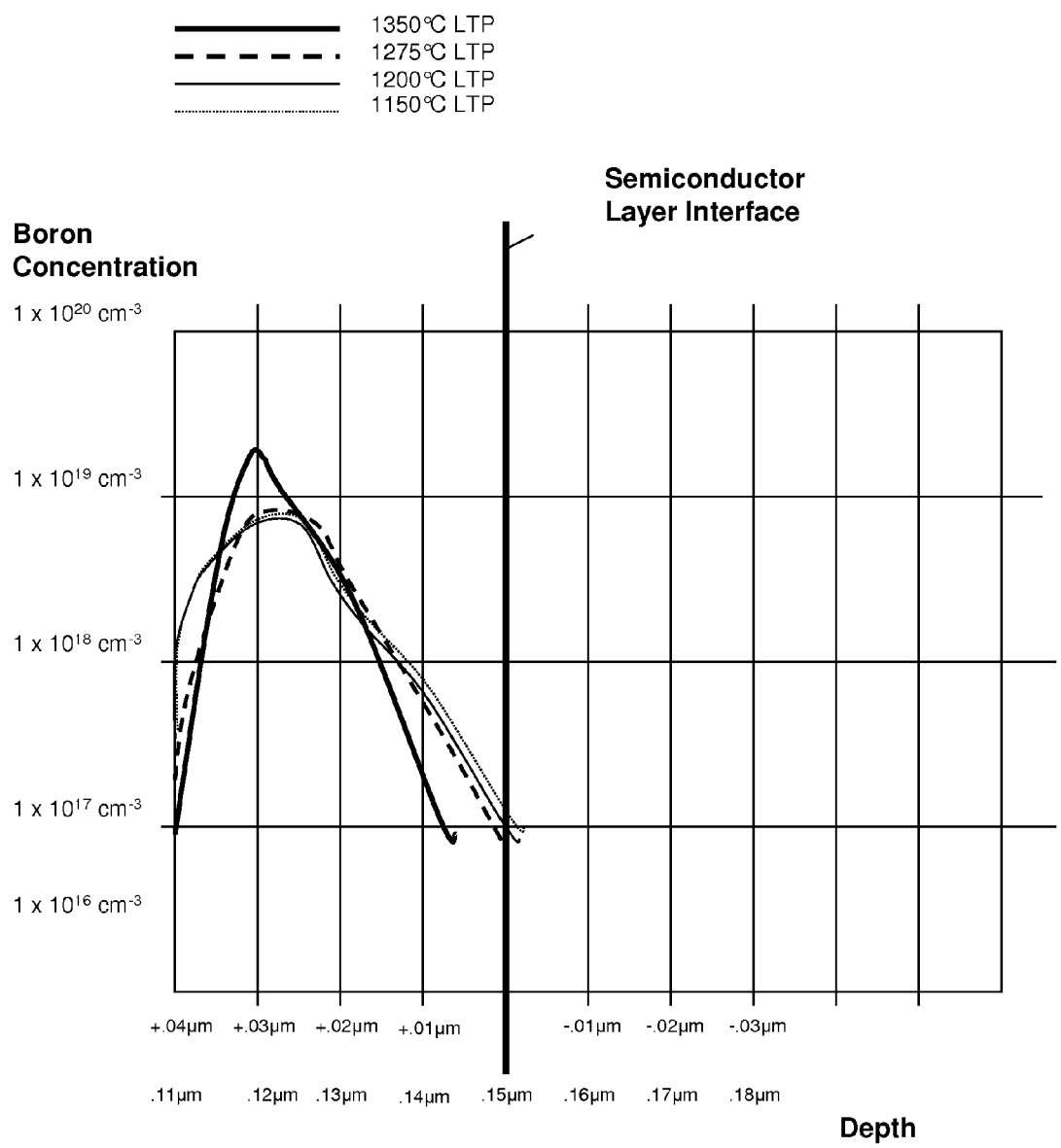
FIG. 2 is a schematic graph illustrating boron concentration profiles achievable in the structure of FIG. 1 using different laser anneal temperatures.
Figure 3:
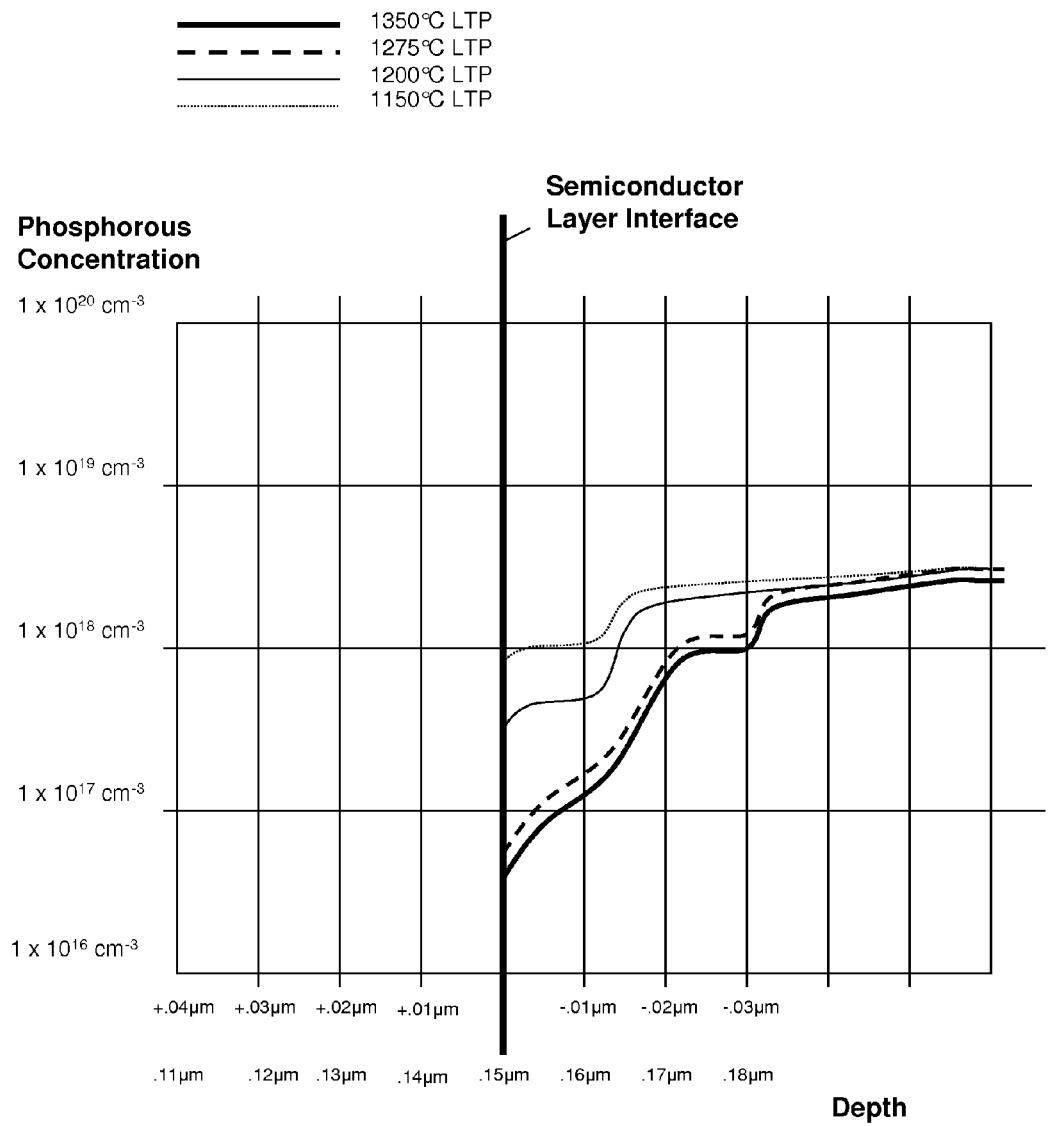
FIG. 3 is a schematic graph illustrating phosphorous concentration profiles achievable in the structure of FIG. 1 using different laser anneal temperatures.

For example, the first dopant diffusion can be minimized such that a peak concentration of the first dopant 181 in the additional semiconductor layer 103 can remain greater than approximately $1\times10^{19}$ cm$^{-3}$ at approximately 0.03 µm above the top surface 112 of the initial semiconductor layer 102 (i.e., just above the interface) and a concentration profile of the first dopant 181 in the initial semiconductor layer 102 is less than approximately $1\times10^{17}$cm$^{-3}$ at the top surface 112 (i.e., just below the interface) and decreases dramatically towards the implant region 120 (see FIGS. 2-3).

Figure 6:
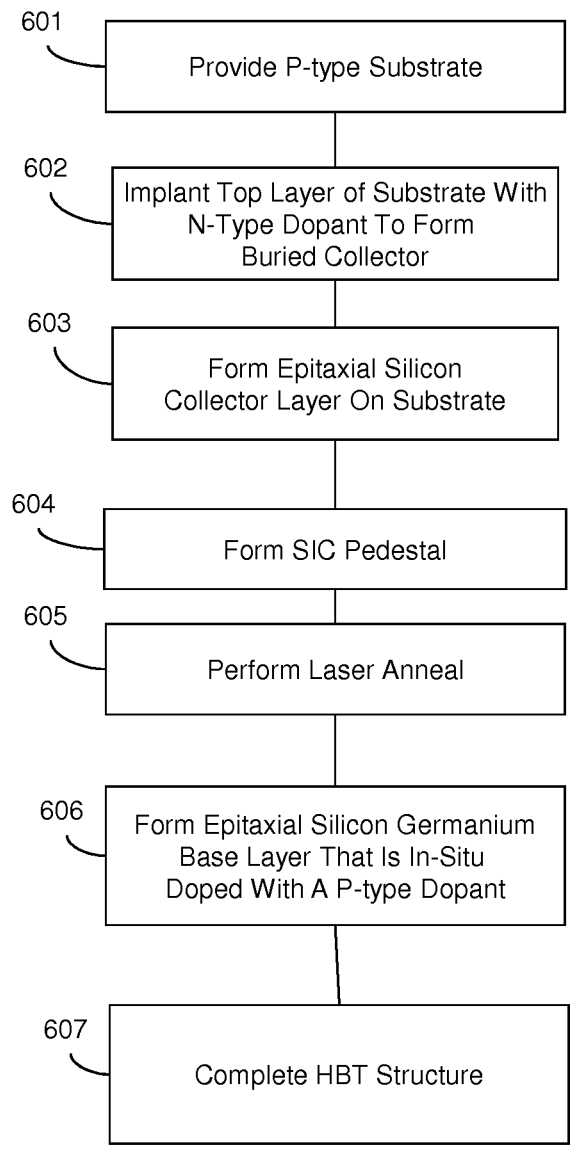
FIG. 6 is a flow diagram illustrating another embodiment of the method of the invention.

Referring to FIG. 6 in combination with FIG. 1, the above-described method can, for example, be used to form a heterojunction bipolar transistor (see transistor 100 of FIG. 1) that has improved current-gain cut-off frequency ($F_t$) and the maximum oscillation frequency ($F_{max}$) over such transistors formed using conventional methods.

Figure 7:
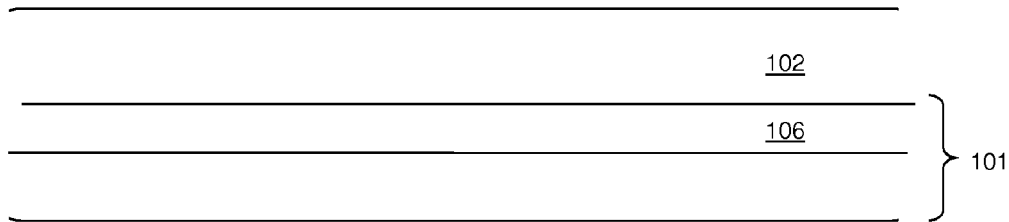
FIG. 7 is a schematic block diagram illustrating a partially completed structure of the invention.

Specifically, a semiconductor substrate 101 that is doped with a first conductivity type dopant 181 (e.g., a substrate doped with a p-type dopant such as boron (B)) is provided (601, see FIG. 7). Then, the top layer 106 of the substrate 101 is doped (e.g., by a conventional ion-implantation process) with a second conductivity type dopant 182 (e.g., an n-type dopant such as phosphorous (P), antimony (Sb) or arsenic (As)), thereby, forming a highly doped sub-collector (i.e., a buried collector) layer 106 at the top of the substrate 101 (602, see FIG. 7).

Then, a silicon collector layer 102 is formed on top of the buried collector layer 106 (603, see FIG. 7). This silicon collector layer 102 can be formed, for example, using a conventional epitaxial deposition process. Impurity ions from the buried collector layer 106 can diffuse into the collector layer 102 so that the collector layer 102 will be lightly doped with the second conductivity type dopant 182.

Figure 8:
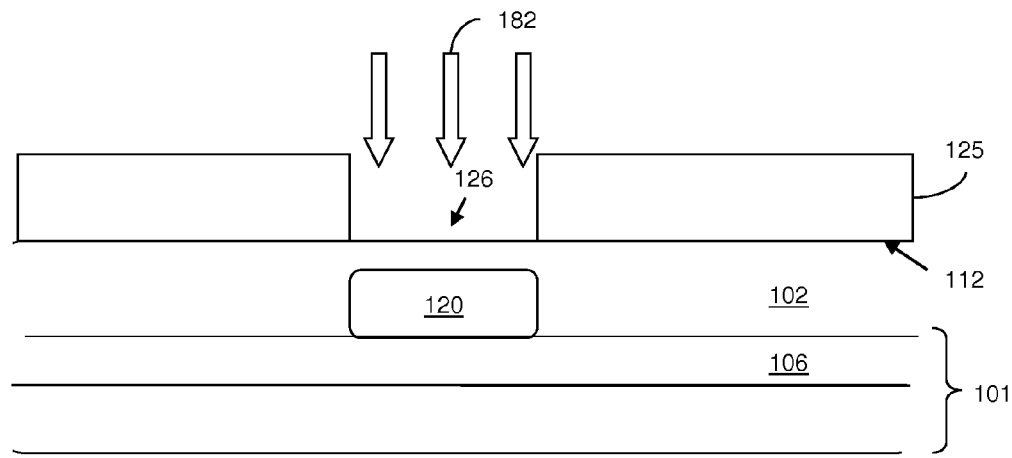
FIG. 8 is a schematic block diagram illustrating a partially completed structure of the invention.

Then, a dopant (i.e., second dopant 182) can be implanted into the silicon collector layer 102 at a predetermined depth (e.g., approximately 0.03 µm below the top surface of the silicon collector layer) in order to form a selective implant collector (SIC) pedestal 120 having an approximately uniform second dopant concentration, for example, a uniform concentration of greater than approximately $1\times10^{18}$ cm$^{-3}$ (604, see FIG. 8).

As with the semiconductor structure, described above, this second dopant 182 can, for example, comprise an n-type dopant such as phosphorous (P), antimony (Sb) or arsenic (As). Formation of the implant region 120 in the desired region of the collector layer 102 can be accomplished by a conventional masked ion-implantation process (e.g., by depositing a photo-resist layer 125, patterning the photo-resist layer 125 to expose a desired portion 126 of the collector layer 102 and implanting the selected dopant 182 into the exposed portion 126 of the collector layer 102).

Figure 9:
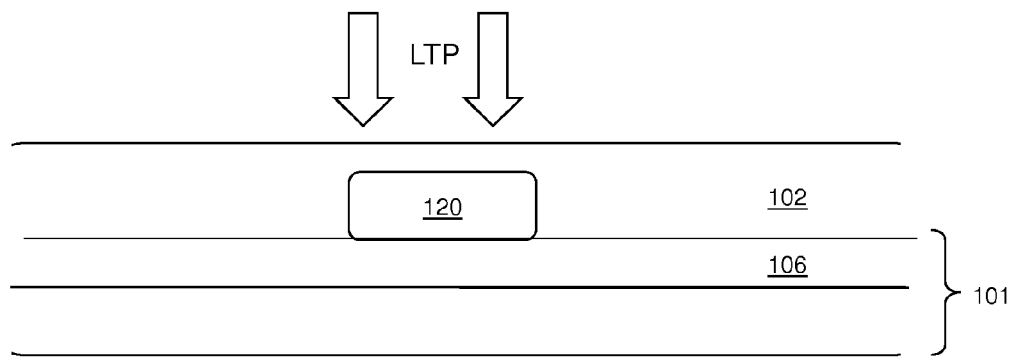
FIG. 9 is a schematic block diagram illustrating a partially completed structure of the invention.

Following the implantation process, the second dopant 182 in the SIC pedestal 120 is activated and any defects that were formed on the top surface 112 of the silicon collector layer 102 as a result of the implantation process are removed by performing a laser anneal (e.g., a laser thermal process (LTP) or a laser spike anneal (LSA)) (605, see FIG. 9). This laser anneal is performed at temperatures greater than approximately 1100° C. and using a technique that avoids melting of the collector layer 102 and achieves a thermal equilibrium in the collector layer 102 in less than approximately 10 ps (i.e., using a millisecond laser anneal process) in order to minimize diffusion of the second dopant 182 from the SIC pedestal 120 and, thereby, keep the second dopant profile narrow. Specifically, diffusion of the second dopant 182 is minimized using this laser anneal, for example, such that a concentration profile of the second dopant 182 outside of the SIC pedestal decreases significantly between the implant region and the top surface 112 of the collector layer 102 (e.g., decreases from approximately $1\times10^{18}$ cm$^{-3}$ at approximately 0.02 µm below the top surface 112 of the collector layer 102 to less than approximately $1\times10^{17}$cm$^{-3}$ near the top surface 112 (see FIG. 3)). The use of such a laser anneal further avoids clustering of point defects and forming of extended defects and dislocation loops at the top surface 112 the silicon collector layer 102 during subsequent processing. Those skilled in the art will recognize that such a laser anneal process in lieu of a rapid thermal anneal (RTA) can be easily integrated into current formation methodologies. Specifically, laser processing methodologies will not disrupt previous or subsequent process models or steps.

Figure 10:
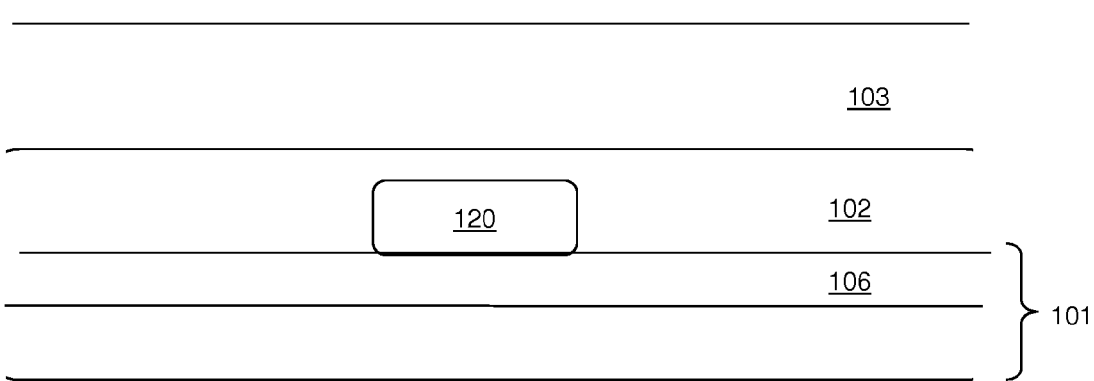
FIG. 10 is a schematic block diagram illustrating a partially completed structure of the invention.

Once the laser anneal is performed, a silicon germanium base layer 103 is formed on the top surface 112 of the silicon collector layer 102 such that it is doped with a different dopant 181 (i.e., a first dopant) (606, see FIG. 10). This first dopant 181 can be different from the second dopant 182 and can, for example, comprise a p-type dopant such as boron (B). This base layer 103 can, for example, be formed by using an epitaxial deposition process in which the base layer 103 is simultaneously formed and in-situ doped with the first dopant 181.

During the in-situ doping process, the base layer 103 can, for example, be doped such that a peak concentration of the first dopant 181 in the silicon germanium layer 103 is greater than approximately $1\times10^{19}$ cm$^{-3}$ at approximately 0.03 µm above the top surface 112 of the silicon collector layer 102 below (i.e., above the interface between the layers 102-103). Diffusion of this first dopant from the silicon germanium base layer 103 into the silicon collector layer 102 below 181 is minimized due to the defect removal process (discussed above at process 605). That is, removal of the defects minimizes unwanted defect-enhanced diffusion of the first dopant 181 and, thereby, maintains the desired dopant concentration in the base layer 103 and further keeps the dopant profile narrow.

Specifically, diffusion of the first dopant 181 from the base layer 103 into the collector layer 102 below is minimized by the lack of defects at the interface 112-113 (i.e., lack of interstitials) such that a peak concentration of the first dopant 181 in the base layer 103 adjacent to the bottom surface 113 (i.e., just above the interface) can remain at least 100 times greater than a concentration of that same first dopant 181 in the collector layer 102. For example, the first dopant diffusion can be minimized such that a peak concentration of the first dopant 181 in the base layer 103 remains greater than approximately $1\times10^{19}$ cm$^{-3}$ at approximately 0.03 µm above the top surface 112 of the collector layer 103 and a concentration profile of the first dopant in the collector layer is less than approximately $1\times10^{17}$cm$^{-3}$ at the top surface 112 and decreases dramatically towards the implant region 120 (see FIGS. 2-3).

Following formation of the silicon germanium base layer 103, conventional processing techniques can be used to complete the HBT structure (607, see FIG. 1), including but not limited to the formation of device isolation structures, the emitter 105, the extrinsic base 104, etc.

Forming the silicon germanium hetero-junction bipolar transistor 100 in this manner has the advantage of completely removing defects (e.g., point-defects) from the collector layer surface and, thereby, reducing outdiffusion of both the SIC and base layer dopants. This results in a narrower base, narrower collector-base junction, reducing collector-base capacitance (Ccb) and increases Fmax. The resulting narrower intrinsic boron profile reduces the base transit time and increases Ft. Furthermore, removal of point defects reduces the probability of forming extended defects such as dislocations, improving device yield. More particularly, referring again to FIG. 1, forming the silicon germanium hetero-junction bipolar transistor 100 in this manner minimizes the diffusion of both the second dopant 182 out of the SIC pedestal 120 and the first dopant 18 into the collector layer 102 (i.e., narrows the profiles of both the base layer 102 and the SIC pedestal 120) and, thereby, allows the bipolar transistor 100 to be formed with a current-gain cut-off frequency ($F_t$) of greater than approximately 365.00 GHz, a maximum oscillation frequency ($F_{max}$) of greater than approximately 255.00 GHz, a collector-base capacitance (Ccb) less than approximately 3.40 fF and a sheet base resistance (Rbb) less than approximately 110.00 Ohms (see FIG. 4).

The embodiments of the method of the invention are described above and illustrated in FIG. 6 in terms of the SIC implant process 604 and laser anneal process 606 being performed prior to the formation of the base layer at process 606. However, similar results (i.e., both improved current-gain cut-off frequency ($F_t$) and improved maximum oscillation frequency ($F_{max}$)) are also achievable when the collector layer is formed at process 602, followed by formation of the base layer 606, formation of the SIC pedestal 604, and finally the laser anneal process 605. That is, results are confirmed with SIC implantation 604 and laser anneal 605 before the base layer formation 606 and also with SIC implantation 604 and laser annea 605 after the base layer formation 606.

Therefore, disclosed above is an improved semiconductor structure (e.g., a silicon germanium (SiGe) hetero-junction bipolar transistor) having a narrow essentially interstitial-free SIC pedestal with minimal overlap of the extrinsic base. Also, disclosed is a method of forming the transistor which uses laser annealing, as opposed to rapid thermal annealing, of the SIC pedestal to produce both a narrow SIC pedestal and an essentially interstitial-free collector. Thus, the resulting SiGe HBT transistor can be produced with narrower base and collector space-charge regions than can be achieved with conventional technology.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A method of forming a semiconductor structure comprising:
    providing a substrate;
    selecting a first dopant and a second dopant different from said first dopant;
    forming an initial semiconductor layer on said substrate, said initial semiconductor layer having a top surface;
    implanting said second dopant into said initial semiconductor layer to form an implant region at a predetermined depth below said top surface;
    removing defects from said top surface of said initial semiconductor layer caused by said implanting and simultaneously activating said second dopant in said implant region with minimal diffusion of said second dopant into other regions of said initial semiconductor layer by performing a laser anneal; and
    forming an additional semiconductor layer on said top surface, said additional semiconductor layer being any one of in-situ doped and subsequently doped with said first dopant,
    said removing said defects minimizing diffusion of said first dopant from said additional semiconductor layer into said initial semiconductor layer.

2. The method of claim 1, said diffusion of said first dopant from said additional semiconductor layer into said initial semiconductor layer being minimized by said removing said defects such that a peak concentration of said first dopant in said additional semiconductor layer adjacent to said top surface of said initial semiconductor layer remains at least 100 times greater than a concentration of said first dopant in a diffusion region of said initial semiconductor layer between said top surface and said implant region.

3. The method of claim 1, said forming of said additional semiconductor layer comprising epitaxially growing said additional semiconductor layer and in-situ doping said additional semiconductor layer such that a peak concentration of said first dopant in said additional semiconductor layer is greater than approximately $1\times10^{19}$ cm$^{-3}$ at approximately 0.03 µm above said top surface.

4. The method of claim 1, said removing said defects minimizing said diffusion of said first dopant from said additional semiconductor layer into said initial semiconductor layer such that a concentration of said first dopant in a diffusion region of said initial semiconductor layer between said implant region and said top surface is less than approximately $1\times10^{17}$ cm$^{-3}$.

5. The method of claim 1, said implanting said second dopant into said initial semiconductor layer comprising implanting said second dopant such that said implant region is approximately 0.03 µm below said top surface and has an approximately uniform second dopant concentration and said laser anneal being performed to activate said second dopant in said implant region with said minimal diffusion of said second dopant into said other regions of said initial semiconductor layer such that said implant region maintains said uniform second dopant concentration.

6. The method of claim 5, said laser anneal being performed at temperatures greater than approximately 1100° C. and using a technique that can achieve a thermal equilibrium in said initial semiconductor layer in less than approximately 10 ps to minimize diffusion of said second dopant from said implant region.

7. The method of claim 6, said laser anneal being performed to activate said second dopant in said implant region with said minimal diffusion of said second dopant into said other regions of said initial semiconductor layer such that a concentration profile of said second dopant outside of said implant region decreases from approximately $1\times10^{18}$ cm$^{-3}$ at approximately 0.02 μm below said top surface to less than approximately $1\times10^{17}$ cm$^{-3}$ near said top surface.

8. The method of claim 1, said additional semiconductor layer comprising a silicon germanium layer, said first dopant comprising boron, said initial semiconductor layer comprising a silicon layer and said second dopant comprising one of phosphorous, antimony and arsenic.

9. The method of claim 1, said laser anneal being performed without melting said initial semiconductor layer and comprising one of a laser thermal process (LTP) and a laser spike anneal (LSA).

10. The method of claim 1, said laser anneal being performed so as to avoid clustering of point defects and forming of extended defects and dislocation loops at said top surface.

11. A method of forming a semiconductor structure comprising:
    providing a substrate;
    selecting a first dopant and a second dopant different from said first dopant;
    forming an initial semiconductor layer on said substrate, said initial semiconductor layer having a top surface;
    implanting said second dopant into said initial semiconductor layer to form an implant region at a predetermined depth below said top surface;
    removing defects from said top surface of said initial semiconductor layer caused by said implanting and simultaneously activating said second dopant in said implant region with minimal diffusion of said second dopant into other regions of said initial semiconductor layer by performing a laser anneal; and
    forming an additional semiconductor layer on said top surface, said additional semiconductor layer being any one of in-situe doped and subsequently doped with first dopant,
    said removing said defects minimizing diffusion of said first dopant from said additional semiconductor layer into said initial semiconductor layer such that a peak concentration of said first dopant in said additional semiconductor layer adjacent to said top surface of said initial semiconductor layer remains at least 100 times greater than a concentration of said first dopant in said initial semiconductor layer, said concentration of said first dopant in said initial semiconductor layer being less than approximately $1\times10^{17}$ cm$^{-3}$.

12. A method of forming a semiconductor structure comprising:
    providing a substrate;
    selecting a first dopant and a second dopant different from said first dopant;
    forming a silicon layer on said substrate, said silicon layer having a top surface;
    implanting said second dopant into said silicon layer to form an implant region at a predetermined depth below said top surface;
    removing defects from said top surface of said silicon layer caused by said implanting and simultaneously activating said second dopant in said implant region with minimal diffusion of said second dopant into other regions of said silicon layer by performing a laser anneal; and
    forming a silicon germanium layer on said top surface, said silicon germanium layer being any one of in-situ doped and subsequently doped with said first dopant, said removing said defects minimizing diffusion of said first dopant from said silicon germanium layer into said silicon layer.

13. The method of claim 12, said diffusion of said first dopant from said silicon germanium layer into said silicon layer being minimized by said removing said defects such that a peak concentration of said first dopant in said silicon germanium layer adjacent to said top surface of said silicon layer remains at least 100 times greater than a concentration of said first dopant in a diffusion region of said silicon layer between said top surface and said implant region.

14. The method of claim 12, said forming of said silicon germanium layer comprising epitaxially growing said silicon germanium layer and in-situ doping said silicon germanium layer such that a peak concentration of said first dopant in said silicon germanium layer is greater than approximately $1\times10^{19}$ cm$^{-3}$ at approximately 0.03 μm above said top surface.

15. The method of claim 12, said removing said defects minimizing said diffusion of said first dopant from said silicon germanium layer into said silicon layer such that a concentration of said first dopant in a diffusion region of said silicon layer between said implant region and said top surface is less than approximately $1\times10^{17}$ cm$^{-3}$.

16. The method of claim 12, said implanting said second dopant into said silicon layer comprising implanting said second dopant such that said implant region is approximately 0.03 μm below said top surface and has an approximately uniform second dopant concentration and said laser anneal being performed to activate said second dopant in said implant region with said minimal diffusion of said second dopant into said other regions of said silicon layer such that said implant region maintains said uniform second dopant concentration.

17. The method of claim 12, said laser anneal being performed at temperatures greater than approximately 1100° C. and using a technique that can achieve a thermal equilibrium in said silicon layer in less than approximately 10 ps to activate said second dopant in said implant region with said minimal diffusion of said second dopant into said other regions of said silicon layer such that a concentration profile of said second dopant outside of said implant region decreases from approximately $1\times10^{18}$ cm$^{-3}$ at approximately 0.02 μm below said top surface to less than approximately $1\times10^{17}$ cm$^{-3}$ near said top surface.

18. The method of claim 12, said first dopant comprising boron and said second dopant comprising one of phosphorous, antimony and arsenic.

19. The method of claim 12, said laser anneal being performed without melting said silicon layer and comprising one of a laser thermal process (LTP) and a laser spike anneal (LSA).

20. The method of claim 12, said laser anneal being performed so as to avoid clustering of point defects and forming of extended defects and dislocation loops at said top surface.

* * * * *